United States Patent [19]

Shriver

[11] Patent Number: 4,625,296
[45] Date of Patent: Nov. 25, 1986

[54] MEMORY REFRESH CIRCUIT WITH VARYING SYSTEM TRANSPARENCY

[75] Inventor: Joseph S. Shriver, Long Branch, N.J.

[73] Assignee: The Perkin-Elmer Corporation, Norwalk, Conn.

[21] Appl. No.: 571,608

[22] Filed: Jan. 17, 1984

[51] Int. Cl.⁴ .......................... G06F 12/16; G11C 7/00
[52] U.S. Cl. ....................................... 364/900; 365/222
[58] Field of Search ... 364/200 MS File, 900 MS File; 365/222

[56] References Cited

U.S. PATENT DOCUMENTS

| | | | |
|---|---|---|---|
| 3,760,379 | 9/1973 | Nibby | 365/222 |
| 4,106,108 | 8/1978 | Cislaghi | 365/222 |
| 4,172,282 | 10/1979 | Aichelmann | 365/222 |
| 4,204,254 | 5/1980 | Muzzani | 365/222 |
| 4,218,753 | 8/1980 | Hendrie | 365/222 |
| 4,249,247 | 2/1981 | Patel | 364/900 |
| 4,317,169 | 2/1982 | Panepinto | 365/222 |

*Primary Examiner*—James D. Thomas
*Assistant Examiner*—Florin Munteanu
*Attorney, Agent, or Firm*—E. T. Grimes; F. L. Masselle

[57] ABSTRACT

A memory refresh circuit controls the refreshing of dynamic RAM included in a system wherein a control store outputs micro-code instructions to control the system operation in response to sequences specified by a sequence and interrupt logic circuit (SIL). A counter transmits certain counts of system machine cycles to an array logic device. In response to one count, the array logic device generates a memory refresh request signal which is applied to a RAM address logic circuit (RAL). The RAL monitors the micro-code instruction output at each machine cycle to determine whether the instruction will access the dynamic RAM during that machine cycle, and if no memory access is detected, the RAL generates a signal to initiate a memory refresh operation, which operation requires two machine cycles to complete.

The array logic device also monitors the micro-code instructions to determine if and when a refresh operation was initiated. If the refresh operation was initiated, the array logic determines whether the instruction in the following machine cycle needs to access the dynamic RAM. If it does, the array logic device generates a freeze clock signal which causes the SIL to freeze the execution of the instruction until the refresh is complete, i.e. this refresh will be partially transparent.

Alternatively, if no refresh has been initiated after a specified number of machine cycles, the array logic device generates an interrupt signal. In response to this interrupt, the SIL causes the control store to execute a pair of NOP instructions to cause an uninterrupted refresh operation.

9 Claims, 2 Drawing Figures

MEMORY REFRESH CIRCUIT WITH VARYING SYSTEM TRANSPARENCY

The present invention relates generally to the field of digital computer memory circuits and particularly to a memory refresh circuit utilized in conjunction with a dynamic random access memory.

In the field of digital computation, random access memories comprise an important element thereof. The random access memory is typically utilized to store both data and data processing programs. In the early days of digital computation, the random access memory utilized magnetic cores for storing data. In such a memory system, once the cores were written to, the data stayed in memory and did not require refreshing. The data could subsequently be read and through a regenerate cycle, be restored to the read locations so the data could subsequently be read again. Core memories, however, had numerous disadvantages including high cost, slow speed, and large size.

With the advent of monolithic circuits, however, dynamic memory circuits have been developed. These circuits utilize various monolithic circuit configurations many of which require refreshing in order to preserve the validity of data stored therein. The refreshing operation itself involves reading a given location of the memory and restoring (rewriting) the data to the same location.

The manufacturers of dynamic random access memory circuits quite typically define the rate of memory refreshing required in order to assure the validity of data. Chip manufacturers often specify circuitry for accomplishing this result with respect to the dynamic random access chips that they manufacture. As the memory cannot operate normally while a refresh operation is in process, it is desirable to initiate the refresh operation when the memory is not in normal use. This would make the refresh entirely transparent to the system. To accomplish this, extensive hardware is usually required to take into consideration many system conditions to determine when a refresh can be started without interfering with the operation of the machine.

While the prior approaches for memory refreshing are effective in doing just that, they generally have certain disadvantages when the same techniques are applied to a computer system designed to be small and relatively less expensive. Such disadvantages include the extent of hardware necessary to produce the memory refresh circuitry. In addition, the specific philosophy for determining when a refresh should occur may not be applicable to the design of another machine.

In view of the foregoing problems, it is a principal objective of the present invention to provide a memory refresh circuit which is inexpensive to implement compared to alternative approaches known in the prior art.

It is a further objective of the present invention to provide a memory refresh circuit which utilizes relatively few circuits and yet is flexible enought to permit application of the circuit according to the present invention in many different applications.

BRIEF DESCRIPTION OF THE INVENTION

The present invention comprises a memory refresh circuit which controls the refreshing of dynamic random access memory (RAM). The dynamic RAM is included in a system in which a control store outputs micro-code instruction signals to control the system operation in response to sequences specified by a sequence and interrupt logic circuit.

The memory refresh circuit of the present invention includes a counter of system machine cycles. The counter transmits certain counts to an array logic device which, in turn, produces a memory refresh request signal and a clock reset signal. The clock reset signal is input into the counter to reset its count to zero. The memory refresh request signal is applied to a RAM address logic circuit which monitors the micro-code instruction signal output by the control store at each machine cycle to determine whether the instruction will access the dynamic RAM during that machine cycle. If not, the RAM address logic circuit generates a signal which is received by the dynamic RAM and a memory refresh operation is initiated. The refresh operation requires two machine cycles to be completed. In effect, when the RAM address logic circuit determines that the micro-code instruction specified by the output of the control store has one machine cycle in which a read or write to the dynamic RAM is not needed, a refresh is started. As a result, the refresh operation is initiated by the RAM address logic circuit at the first machine cycle after the memory refresh request signal was generated that the control store outputs a micro-code instruction that does not need to access dynamic RAM.

After generating the memory refresh request signal, the array logic device monitors the control store output micro-code instructions to determine if and when a refresh operation was initiated by the RAM address logic circuit. It also monitors one of the counts input thereto from the counter. If it determines that a refresh operation was initiated, the array logic device determines whether the micro-code instruction output by the control store for execution during the following machine cycle needs to access the dynamic RAM. If it does, the array logic device generates a freeze clock signal which is input into the sequence and interrupt logic circuit. In response to this signal, the sequence and interrupt logic circuit freezes the execution of the instruction until the refresh operation is complete, i.e. for one machine cycle in this case.

As discussed above, after generating the memory refresh request signal, the array logic device monitors the control store output instructions and another of the counts input thereto from the counter. In the event that the counter has reached a certain value without a refresh operation having been initiated by the RAM address logic circuit, the dynamic RAM must be refreshed or there is a danger that data will be lost. In this case, the array logic device generates an interrupt signal which is input into the sequence and interrupt logic circuit. When the sequence and logic honors this interrupt, a vector is performed to a pair of microprogram instructions located in the control store, for example "no operation" (NOP) instructions which are interpreted by the RAM address logic circuit as not requiring an access to the dynamic RAM. The first instruction causes the RAM address logic circuit to generate a signal to initiate a refresh operation and the second instruction enables the refresh operation to be completed without interruption.

BRIEF DESCRIPTION OF THE DRAWINGS

The foregoing and other objects, advantages, and features of the present invention are described below in connection with the drawings which form a part of the original disclosure wherein.

DETAILED DESCRIPTION

Figure 1:
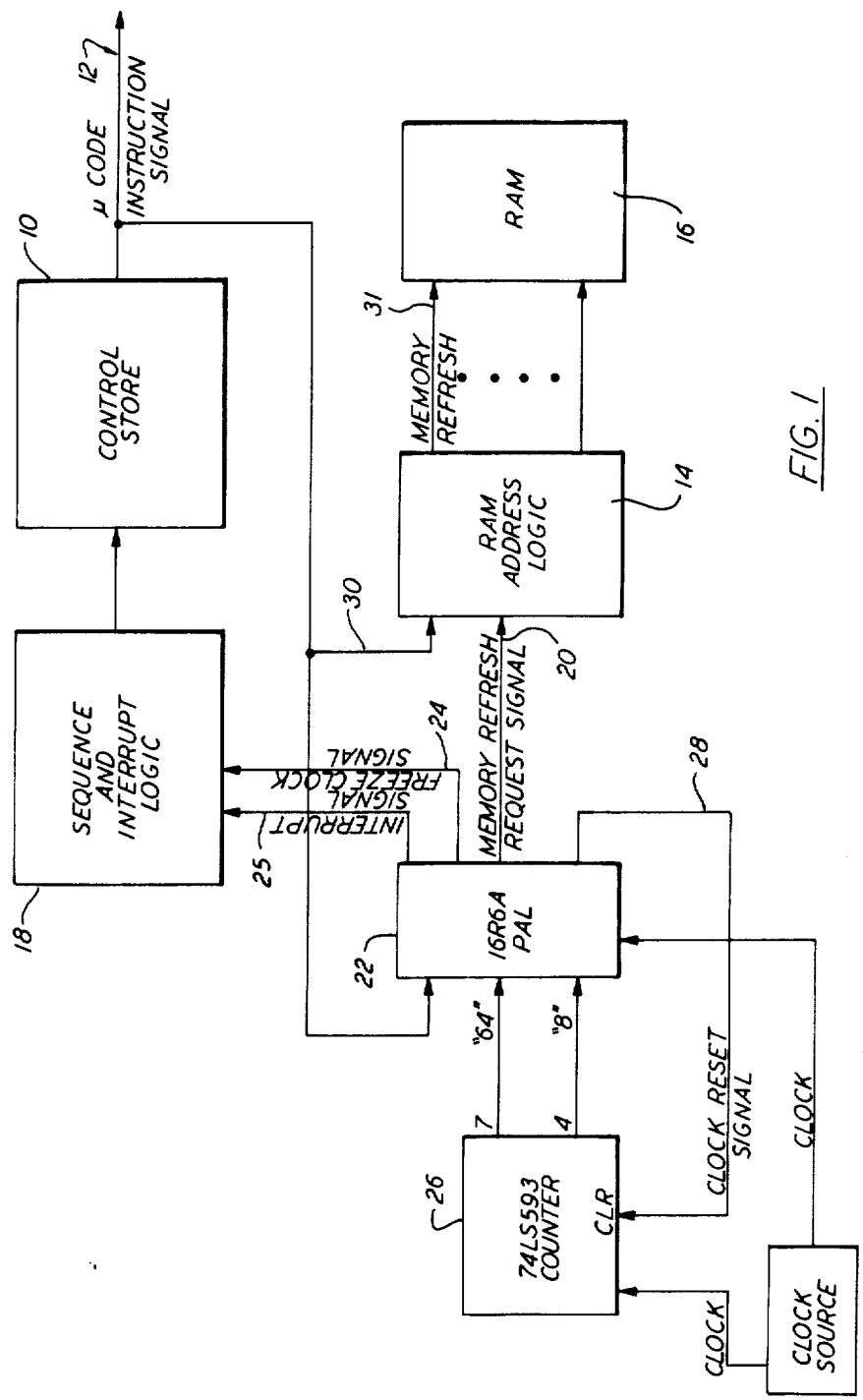
FIG. 1 comprises a block diagram of the system according to the present invention and FIG. 2 comprises a block diagram of various circuits implemented in array logic device 22 shown in FIG. 1.

The system according to the present invention as illustrated in FIG. 1 includes a control store 10 of a conventional nature which is utilized with the system for producing micro-code instruction signals on a micro-code instruction signal bus indicated generally at 12. The micro-code instruction signals are transmitted throughout the computer system and comprise gate signals utilized by the system to control the internal operation of the circuits of the computer. These signals include signals, for example, which are directed to the random access memory (RAM) address logic 14 which may, for example, initiate a read operation of data from the dynamic RAM 16 from a location having an address defined by the content of, for example, a register (not shown) in the logic 14. The micro-code instruction signals are also used in a conventional manner for numerous other purposes which are specified by the designer of the particular computer system.

The sequence of data appearing on the micro-code instruction signal bus 12 is controlled by the sequence and interrupt logic 18. This sequence and interrupt logic 18 is operative to select the address which is applied thereby to the control store 10 so as to produce at the micro-code instruction signal bus 12 the signals corresponding to the data stored at the addressed location of the control store 10 for the current machine circuit operation. As the present invention relates to a memory refresh cycle for a Perkin-Elmer 3205, the sequence and control logic in that computer is suitable for application in the present invention. Specific details are the sequence and interrupt logic is described in a patent application co-pending herewith filed on Jan. 17, 1984, Ser. No. 571,607 entitled Multi-Level Priority Micro-Interrupt Controller. That patent application has been assigned to the assignee of the present patent application and the content thereof is incorporated therein in its entirety by reference.

The random access memory (RAM) 16 in the present invention utilizes dynamic memory chips which must be refreshed approximately every 15 to 16 microseconds in order to assure the accuracy of the data contained therein. The specific chips are manufactured by Fujitsu and have a circuit type of that included in their Part #8266A-12 or in the Inmos Part #2600-10.

The micro-code instruction signals on bus 12 are input into RAM address logic circuit 14 on line 30 along with a memory refresh request signal on line 20. RAM address logic circuit 14 determines whether a micro-code instruction signal requires an access to RAM 16. If the memory refresh request signal is present on line 20 and the micro-code instruction signal does not require an access to RAM 16 during the current machine cycle, RAM address logic circuit 14 generates a signal which is applied over line 31 to RAM 16 and, in response thereto, it initiates a refresh operation. Since the memory refresh operation takes two machine cycles to complete, RAM address logic 14 cannot determine whether there will be two machine cycles available for the refresh operation to be completed. Thus, RAM address logic circuit 14, in response to the memory refresh request signal on line 20 and indications from the bus 12 that the RAM is not being used during the current cycle, causes an immediate refresh to begin. If the next machine cycle does not contain a fetch or store to the ARM 16, the memory refresh initiated by the signal on line 20 is completely transparent to the operation of the system as a whole. In the event that a refresh is started and the following machine cycle requires an access to the RAM 16, the system is frozen (stopped) until the refresh is completed. Accordingly, this memory refresh is only 50% transparent to system performance as at least one machine cycle must be deferred so as to permit completion of the refresh function.

The suspending of operation of the machine is performed by an array logic device 22, implemented here by a programmed array logic (PAL) over the line 24 which couples to the sequence and interrupt logic 18. The programmed array logic 22 is coupled at its input to the micro-code instruction signal bus 12 as well as to the output of a counter 26. Assuming for the moment that the programmed array logic 22 has produced a memory refresh request signal on the line 20, the programmed array logic 22 monitors the signals on the micro-code instruction signal bus 12 to determine when a cycle becomes available in which no RAM request is present. This machine cycle is called a start cycle. Accordingly, the programmed array logic 22 can identify when the memory refresh function begins. Then, if the following micro-cycle includes commands on the micro-code signal bus 12 which require a RAM access, the programmed array logic 22 responds to this condition and produce a freeze clock signal on the line 24 causing the machine to suspend further operation until completion of the memory refresh at the end of that machine cycle, called the after cycle.

The memory refresh request signal on line 20 is actually produced by the programmed array logic 22 in response to the output of the counter 26. Two outputs of this counter are selected so as to correspond to the desired refresh rate of the RAM 16. In the preferred embodiment of the present invention, the counter 26 comprises an 8 bit binary counter, type 74LS593 which counts the clock pulses on the line from the system master clock and one pulse on this line occurs every 200 nanoseconds (ns) which is the basic machine cycle speed of the computer utilizing the present invention. Accordingly, the counter 26 increments every 200 ns.

The counter 26 causes the line labeled "8" to have an active level whenever the "8" bit of the counter output is active and the line labeled "64" to become active whenever the 64 bit of the counter output is active. Accordingly, the two lines "8" and "64" go active together after 72 machine cycles have occurred following a reset. These two signals are input to the programmed array logic 22 and interpreted thereby to produce the memory refresh request signal on the line 20. At the same time, the programmed array logic 22 places a clock reset signal on the line 28 to the counter 26 thereby causing the counter 26 to be reset to 0. Since the programmed array logic 22 can determine from the micro-code instruction signal bus 12 that no memory access is required during the current machine cycle, a memory refresh started indication signal is produced internally. During the following machine cycle, the memory refresh request signal on line 20 is reset.

Since the refresh function is important to maintaining data integrity in the RAM 16, the circuitry of the present invention must execute a refresh function regardless of whether the micro-machine is constantly requesting service of the RAM 16. In order to accomplish this, the programmed array logic 22 responds to a signal on the line "8" when the memory refresh request signal is active on line 20 by producing an interrupt request on the line 25 to the sequence and interrupt logic 18. This interrupt request on the line 25 is operative to interrupt the micro-code sequence, after all higher level interrupts then pending have been processed, and force the control store 10 to execute two micro-instructions which do not include any RAM 16 service, for example two NOP or no operation instructions. This request for such an interrupt occurs 8 machine cycles after the memory refresh request signal on the line 20 goes active. Since this type of interrupt completely interferes with the operation of the machine, it is not transparent thereto and, accordingly, it should only occur when a memory refresh is absolutely necessary. Accordingly, the count of the counter 26 has been selected to trigger the interrupt by the programmed array logic 22 at substantially the last possible moment before a memory refresh must occur.

Those of skill in the art will recognize that the RAM address logic circuit 14 is conventional and includes circuitry for decoding the micro-code instruction signal bus 12 to determine when a given machine cycle does not require access to the RAM 16. The RAM address logic circuit 14 in addition responds to the memory refresh request signal on line 20 to produce the refresh function within the RAM 16 in a conventional manner for the particular RAM chips utilized in the dynamic RAM 16. In addition, those of skill in the art will recognize that the particular counter 26 signals which trigger the PAL 22 to produce the memory refresh request signal on line 20 has been selected in the discussed embodiment to particularly match requirements of the RAM chips within the RAM 16. If different chips are utilized and different clock cycles, the output of the counter 26 must be adjusted accordingly.

The programmed array logic 22 must be configured in the conventional manner so that the input signal will produce the desired output signals in accordance with the functions described above.

Figure 2:
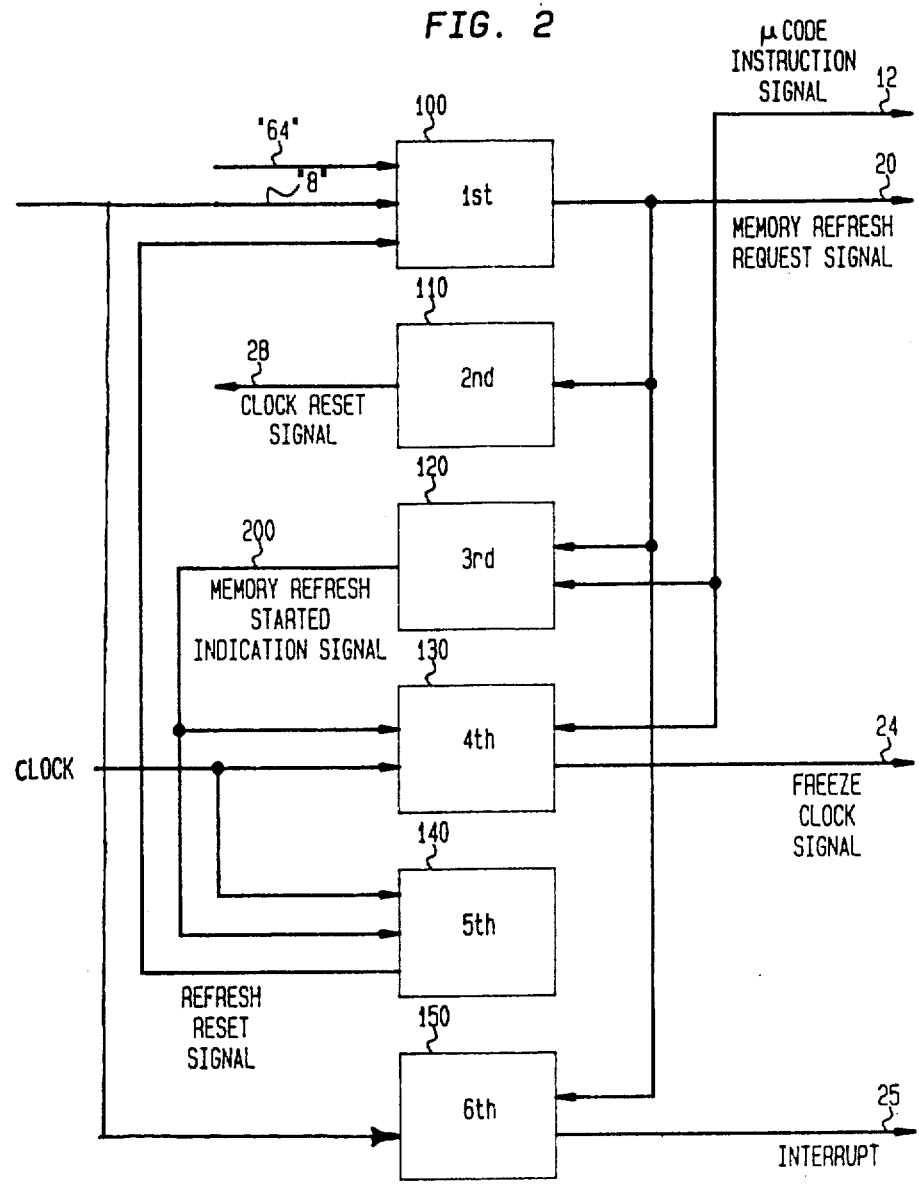

FIG. 2 show a block diagram of various circuits implemented in programmed array logic 22 in the conventional manner. In particular the PAL 22 is configured to include a first circuit means 100 responsive to the "8" and "64" bit signals being active to produce the memory refresh request signal on line 20. The PAL 22 is further configured to produce a second circuit means 100 responsive to the memory refresh request signal to include a clock reset signal on line 28 to reset the counter 26. The PAL 22 includes a third circuit means 120 responsive to the memory refresh request signal and selected micro-code instruction signals which are inactive when the RAM 16 refresh service is being requested to produce a memory refresh started indication signal on line 200 to indicate that a refresh operation has started A fourth circuit means 130 in the PAL 22 responds to the memory refresh started indication signal originating on line 200 and to the micro-code instruction signals from line 12 indicating RAM 16 refresh service is requested in the machine cycle after the refresh started is produced to generate a freeze clock signal on line 24 to the sequence and interrupt logic 18 to freeze the machine until the refresh is completed. The PAL 22 has a fifth circuit means 140 responsive to the memory refresh started indication signal originating on line 200 in the cycle after that signal was first generated to reset the first circuit means 100 and remove the memory refresh request signal from line 20. The PAL 22 has a sixth circuit means 150 responsive to the memory refresh request signal from line 20 and to a selected output line from the counter 26, 8, to produce an interrupt signal on line 25 to the sequencer and interrupt logic 18.

Those of skill in the art will readily recognize that various changes in the design as described above may be made without departing from the spirit and scope of the present invention as defined in the following claims.

What is claimed is:

1. In a system including a clock source for generating a clock signal, a system machine cycle being determined by reference to the clock signal, a refreshable memory means, a sequence and interrupt logic circuit, and a control store for producing micro-code instruction signals each system machine cycle in response to addresses generated by the sequence and interrupt logic circuit, a memory refresh request circuit comprising, in combination:

a counter, responsive to the clock signal, for producing at least one count signal representing at least one count of the clock signal, the counter also being responsive to a clock reset signal to reset the counter;

an array logic device, responsive to the at least one count and to the micro-code instruction signals,
(a) for producing a memory refresh request signal and the clock reset signal when a specified count has been achieved,
(b) for producing a freeze clock signal to block further sequencing of the sequence and interrupt logic circuit during a machine cycle referred to as an after cycle, which after cycle follows a machine cycle referred to as a start cycle, when the micro-code instruction signal to be executed during the after cycle requires an access to the memory means, a start cycle being determined by the array logic device to occur when the memory refresh request signal has been produced and the micro-code instruction signal to be executed during that machine cycle does not require an access to the memory means, and
(c) for producing an interrupt signal which is input into the sequence and logic circuit when a second specified count has been achieved after the memory refresh request signal has been produced without a start cycle being determined to have occurred.

2. The memory refresh circuit of claim 1 wherein the array logic device comprises:

first means, responsive to the at least one count, for producing the memory refresh request signal when said specified count has been achieved, the first means also being responsive to a refresh reset signal to clear the memory refresh request signal;

second means, responsive to the memory refresh request signal, for generating the clock reset signal;

third means, responsive to the memory refresh request signal and to the micro-code instruction signals, for producing a memory refresh started indication signal when the micro-code instruction signal to be executed during a machine cycle does not require an access to the memory means and the memory refresh request signal is active, which machine cycle is referred to as the start cycle;

fourth means, responsive to the memory refresh started indication signal and to the micro-code instruction signals in the machine cycle following the start cycle, which machine cycle is the after cycle, for producing the freeze clock signal which is applied to the sequence and interrupt logic circuit to block further sequencing thereof during the after cycle when the micro-code instruction signal to be executed during the after cycle requires an access to the memory means;

fifth means, responsive to the memory refresh started indication signal during the after cycle, for producing the refresh reset signal; and sixth means, responsive to the memory refresh request signal and to the second specified count signal, for producing the interrupt signal which is input into the sequence and logic circuit.

3. The memory refresh circuit of claim 2 wherein the clock signal comprises clock pulses, the time interval between two clock pulses being substantially equal to the time of a machine cycle.

4. The memory refresh circuit of claim 3 wherein the counter provides a binary count signal on a plurality of output lines, which binary count signal represents the binary count in the counter.

5. The memory refresh circuit of claim 4 wherein the first means is responsive to at least two output lines from the counter to produce the memory refresh request signal when two output lines are simultaneously active.

6. The memory refresh circuit of claim 5 wherein the third means is responsive to selected ones of the micro-code instruction signals which do not require an access to the memory means.

7. The memory refresh circuit of claim 6 wherein the fourth means is responsive selected ones of the micro-code instruction signals which require an access to the memory means.

8. The memory refresh circuit of claim 1 wherein the system further comprises a RAM address logic circuit, responsive to the memory refresh reqeust signal and to the micro-code instruction signals, for producing a memory refresh signal when the micro-code instruction signal to be executed during a machine cycle does not require an access to the memory means and the memory refresh request signal is active, in response to which memory refresh signal the memory means initiates a refresh operation.

9. The memory refresh circuit of claim 2 wherein the system further comprises a RAM address logic circuit, responsive to the memory refresh request signal and to the micro-code instruction signals, for producing a memory refresh signal when the micro-code instruction signal to be executed during a machine cycle does not require an access to the memory means and the memory refresh request signal is active, in response to which memory refresh signal the memory means initiates a refresh operation.

* * * * *